(12) United States Patent
Hidaka et al.

(10) Patent No.: US 7,102,206 B2
(45) Date of Patent: Sep. 5, 2006

(54) SEMICONDUCTOR SUBSTRATE, METHOD FOR FABRICATING THE SAME, AND METHOD FOR FABRICATING SEMICONDUCTOR DEVICE

(75) Inventors: Yoshiharu Hidaka, Osaka (JP); Katsuyuki Ikenouchi, Toyama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 30 days.

(21) Appl. No.: 10/754,518

(22) Filed: Jan. 12, 2004

(65) Prior Publication Data

US 2004/0140536 A1    Jul. 22, 2004

(30) Foreign Application Priority Data

Jan. 20, 2003   (JP)   ............................. 2003-011017

(51) Int. Cl.
*H01L 29/06*   (2006.01)

(52) U.S. Cl. ............... 257/618; 257/620; 257/E23.179; 451/44

(58) Field of Classification Search ................ 257/618, 257/620, E21.237, E21.23, E21.239, 792, 257/E23.179; 451/44, 57, 258, 65; 438/455–460
See application file for complete search history.

(56) References Cited

U.S. PATENT DOCUMENTS

| | | | | |
|---|---|---|---|---|
| 4,905,425 A | * | 3/1990 | Sekigawa et al. | ............. 451/41 |
| 5,185,965 A | * | 2/1993 | Ozaki | .......................... 451/44 |
| 5,490,811 A | * | 2/1996 | Hosokawa | .................. 451/239 |
| 6,174,222 B1 | * | 1/2001 | Sato et al. | ..................... 451/44 |
| 6,439,969 B1 | * | 8/2002 | Koma et al. | .................. 451/41 |
| 6,544,805 B1 | * | 4/2003 | Holcman et al. | ............. 438/14 |
| 6,583,029 B1 | * | 6/2003 | Abe et al. | .................... 438/455 |
| 6,777,820 B1 | * | 8/2004 | Chiba et al. | ................ 257/797 |
| 6,808,784 B1 | * | 10/2004 | Hashimoto et al. | ....... 428/65.3 |
| 2001/0036738 A1 | | 11/2001 | Hatanaka et al. | |
| 2002/0164934 A1 | | 11/2002 | Honda | |

FOREIGN PATENT DOCUMENTS

| | | | |
|---|---|---|---|
| CN | 1267085 A | | 9/2000 |
| DE | 43 31 727 A1 | | 3/1994 |
| EP | 1150339 | * | 10/2001 |
| JP | 406061201 | * | 3/1994 |
| JP | 9-36073 | | 2/1997 |
| JP | 2000-082688 | | 3/2000 |
| JP | 02003060013 | * | 2/2003 |
| JP | 2004198264 | * | 7/2004 |
| KR | 2000-0076805 | | 12/2000 |

* cited by examiner

*Primary Examiner*—Thao X. Le
(74) *Attorney, Agent, or Firm*—McDermott Will & Emery LLP

(57) ABSTRACT

In a semiconductor substrate having a notch in an edge portion thereof, each of the two shoulder portions of the notch is configured as an arc and the difference in curvature between the two shoulder portions of the notch is not less than 0 mm and not more than 0.1 mm.

6 Claims, 12 Drawing Sheets

R1: 0.788 mm
R2: 0.794 mm
Vr: 1.042 mm
θv: 91.6°

| R1−R2 | <0.1mm
+
R1, R2>0.3mm

First Comparative Example

First Comparative Example

Second Comparative Example

Second Comparative Example

SEMICONDUCTOR SUBSTRATE, METHOD FOR FABRICATING THE SAME, AND METHOD FOR FABRICATING SEMICONDUCTOR DEVICE

BACKGROUND OF THE INVENTION

The present invention relates to a semiconductor substrate, a method for fabricating the same, and a method for fabricating a semiconductor device.

The recent rapid advancement of miniaturization technology has achieved an exponential increase in the number of semiconductor elements in a semiconductor device, i.e., a higher degree of integration. Accordingly, active regions to be formed with semiconductor elements and isolation regions between the semiconductor elements have been reduced in size significantly. As a result, STI (Shallow Trench Isolation) which buries an oxide insulating film in fine trenches provided in a substrate has been used as a replacement isolation method for LOCOS isolation involving an oxidation process.

A specific method for forming the STI is as follows. First, isolation trenches are formed in a substrate and then an oxide insulating film is buried in each of the isolation trenches by CVD (Chemical Vapor Deposition). Thereafter, the portions of the oxide insulating film formed on active regions are removed by CMP (Chemical Mechanical Polishing), while the surfaces of the portions of the oxide insulating film buried in the isolation trenches are planarized, whereby steps produced on the surfaces of isolation regions and the active regions are removed.

When CMP is performed, an end-point detection film for notifying whether or not planarization of an entire semiconductor wafer or in terms of semiconductor devices (chips) has been accomplished is formed under the oxide insulating film, as shown in, e.g., Japanese Laid-Open Patent Publication No. 9-36073. At present, a nitride film (SiN film) is used normally as the end-point detection film. When the nitride film is used as the end-point detection film, polishing conditions including a load (load under which a wafer is pressed against a polishing pad) and the speed of rotation (the speed of rotation of each of the polishing pad and the wafer) are set such that a polishing speed for the oxide insulating film is double or more a polishing speed for the nitride film. In a CMP process disclosed in, e.g., Japanese Laid-Open Patent Publication No. 9-36073, the ratio of the polishing speed for the oxide insulating film to the polishing speed for the end-point detection film is about 3 to 5.

A typical polishing sequence for CMP is as follows. That is, since the reflectivity of light detected by an end-point detector or the torque of a motor for rotating the platen of a polishing apparatus changes upon the exposure of the nitride film (end-point detection film), the polishing speed for the nitride film is reduced abruptly starting from the time of exposure, while over polishing is performed, whereby an entire semiconductor wafer is further planarized.

Steps produced on the surface of the substrate when CMP for forming the STI is performed (hereinafter referred to as STI-CMP), i.e., variations in planarization process are substantially determined by variations (surface roughness on the nitride film) in the thickness (final thickness) of the nitride film remaining on the surface of the substrate. In the case of forming, e.g., a MOS transistor on a semiconductor substrate, it is necessary to preliminarily remove the nitride film as the end-point detection film. If the final thickness of the foregoing nitride film has variations, steps are produced on the surface of the substrate after the removal of the nitride film to cause size variations in lithography for electrode processing or the like.

In accordance with the conventional STI-CMP, variations in planarization process, i.e., variations in the final thickness of the nitride film can be suppressed to an objective value of about 30 to 50 nm or less at the portion of a semiconductor wafer other than the peripheral edge portion thereof extending radially about 5 mm from the edge surface of the wafer. However, the uniformity of an amount of grinding of the nitride film (the ratio of an error to an objective amount of grinding) cannot be suppressed to 5% or less at the foregoing peripheral edge portion of the wafer (especially in a range of the peripheral edge portion extending radially about 2 to 5 mm from the edge surface of the wafer) and hence the foregoing objective value cannot be achieved. This is a factor which hinders the enlargement of the effective region of the wafer as a determinant of the number of chips obtainable from the semiconductor wafer.

As the miniaturization rules are reduced increasingly from 130 nm to 65 nm, a necessity occurs to suppress variations in the final thickness of an end-point detection film such as a nitride film over the surface of the wafer after STI-CMP to a more stringent objective value of about 20 to 30 nm or less. However, the objective value cannot be achieved by using the conventional CMP technology including the semiconductor wafer, the end-point detection film (such as the nitride film), and the end-point detection method which are used currently in combination. In this case, variations in the final thickness of the end-point detection film eventually lead to steps produced on the isolation region and steps produced on the active region to be formed with a semiconductor element so that a problem such as size variations or an inter-electrode short circuit occurs during the formation of, e.g., the gate electrode of a MOS transistor.

SUMMARY OF THE INVENTION

In view of the foregoing, it is therefore an object of the present invention to suppress the production of a step on the surface of a substrate after CMP.

To attain the object, the present inventors examined a factor which hinders sufficient suppression of variations in the final thickness of an end-point detection film at the peripheral edge portion of a wafer after the conventional STI-CMP and made the following findings.

In the fabrication of a semiconductor device, a wafer provided with a notch or an orientation flat has been used conventionally. The notch (V-shaped indentation) is formed in the peripheral edge portion of a semiconductor wafer to define, e.g., the crystal orientation of the wafer or the orientation of the wafer in lithography. The configuration (depth, angle, and the like) of the notch and the final configuration of the edge surface of the finished wafer are defined in the SEMI (Semiconductor Equipment and Materials International) standards. In accordance with the SEMI standards, the angle (angle formed between two side surfaces forming a V-shaped configuration) of the notch is about 90 degrees and the depth of the notch measured from the edge surface of the wafer is about 1 to 2 mm.

The present inventors found that, as CMP has been used prevalently to planarize the surface of a wafer in step with the increasing miniaturization of a semiconductor device, the notch and orientation flat had impaired the flatness of the wafer surface after CMP.

Specifically, CMP is performed by rotating each of a polishing pad affixed to a platen and a semiconductor wafer, while simultaneously pressing the semiconductor substrate against the polishing pad. Since the semiconductor substrate is pressed against the polishing pad under a load of about 1 N/cm² or more, pores in urethane foam composing the polishing pad are crushed so that an abrasive is not supplied evenly to the entire surface of the semiconductor wafer and the polishing speed is thereby reduced. To prevent this, measures have been taken which uniformly move a dresser (not shown) having diamond mounted in fixed relation thereon over the polishing pad to roughen the surface of the polishing pad and thereby stabilize the polishing speed.

However, each of the shoulder portions of the notch provided in the semiconductor wafer has the effect of roughening the surface of the polishing pad, not the effect of crushing the polishing pad, since it functions as a singularity point which perpendicularly hits on the polishing pad during polishing. As a result, the surface portion of the polishing pad corresponding to the locus of the notch along which the notch has moved during, e.g., STI-CMP is roughened, which causes the possibility that the polishing speed of the locus portion of the polishing pad is increased unintentionally. At present, the setting of the speed of rotation of, e.g., the semiconductor wafer or the polishing pad and the like is performed such that an arbitrary point on the semiconductor wafer follows a random locus on the polishing pad during polishing. However, since the semiconductor wafer is not fixed completely to the head (not shown) of the polishing machine, it is difficult to render the locus on the polishing pad followed by an arbitrary point on the semiconductor wafer as random as calculated so that the same locus occurs at each constant speed of rotation.

In an attempt to accomplish the foregoing object, the present inventors came to the idea of forming a notch as a singularity point on the semiconductor wafer into a configuration which allows a reduction in the surface roughness of the polishing pad. Specifically, the present inventors measured, for each of a plurality of semiconductor wafers, the final thickness of a nitride film after STI-CMP over the entire surface of the wafer, determined a correlation between the result of measurement and the configuration of the notch in each of the wafers, and found that the notch had impaired the flatness of the wafer surface after CMP. The present inventors also found that, when CMP was performed with respect to a semiconductor wafer having a specified notched configuration, the uniformity of an amount of grinding of the nitride film was suppressed successfully to 5% or less at the portion of the semiconductor wafer other than the peripheral edge portion thereof extending radially about 2 mm from the edge surface of the wafer and variations in the final thickness of the nitride film after STI-CMP were suppressed successfully to 30 nm or less.

The present invention has been achieved based on the foregoing findings and a semiconductor substrate according to the present invention is a semiconductor substrate having a notch in an edge portion thereof, the notch having two shoulder portions each configured as an arc and a difference in curvature between the two shoulder portions being not less than 0 mm and not more than 0.1 mm.

In the semiconductor substrate according to the present invention, the two shoulder portions of the notch have equal curvatures so that, when CMP is performed with respect to the semiconductor substrate, the roughening of the specific portion of the polishing pad by the notch is prevented. Accordingly, the polishing speed becomes uniform over the entire surface of the polishing pad so that the uniformity of an amount of grinding of the polished film at the substrate surface is improved and variations in the final thickness of the polished film after CMP are suppressed sufficiently. This suppresses the production of a step on the surface of the substrate after CMP, prevents a situation in which a problem such as size variations or an inter-electrode short circuit during the formation of a gate electrode occurs, and thereby improves the reliability of the semiconductor device.

In the present specification, the shoulder portions of the notch indicate the connecting portions between the notch wall surfaces and the edge surface of the wafer, the configuration of each of the notch shoulder portions (or the notch bottom portion) indicates a configuration when the notch shoulder portion (or the notch bottom portion) is viewed from above the principal surface of the substrate, i.e., the principal surface of the wafer, and the curvature of each of the notch shoulder portions (or the notch bottom portion) indicates the curvature of the configuration thereof In the semiconductor substrate according to the present invention, each of the two shoulder portions preferably has a curvature not less than 0.3 mm.

The arrangement more reliably prevents the roughening of the polishing pad by the notch.

In the semiconductor substrate according to the present invention, the notch preferably has a bottom portion configured as an arc and the bottom portion preferably has a curvature not less than 1 mm. In this case, the notch more preferably has two wall surfaces each mirror-finished and forming an angle not less than 89° and not more than 95° therebetween.

The arrangement more reliably prevents the roughening of the polishing pad by the notch.

A first method for fabricating a semiconductor device according to the present invention assumes a method for fabricating a semiconductor device using the semiconductor substrate according to the present invention, the method comprising the steps of: burying an insulating film or a conductive film in a depressed portion provided in the semiconductor substrate; and planarizing the insulating film or the conductive film by chemical mechanical polishing.

In accordance with the first method for fabricating a semiconductor device, CMP is performed with respect to the film to be polished which has been buried in the depressed portion provided in the semiconductor substrate according to the present invention so that variations in the final thickness of the polished film after CMP are suppressed sufficiently. This suppresses the production of a step on the surface of the substrate after CMP, prevents a situation in which the step causes a problem in the process step subsequent to CMP, and thereby improves the reliability of the semiconductor device.

A second method for fabricating a semiconductor device according to the present invention assumes a method for fabricating a semiconductor device using the semiconductor substrate according to the present invention, the method comprising the steps of: forming an end-point detection film on the semiconductor substrate; performing etching with respect to the end-point detection film and the semiconductor substrate by using a mask pattern to form an isolation trench; burying an insulating film in the isolation trench; and planarizing the insulating film by chemical mechanical polishing.

In accordance with the second method for fabricating a semiconductor device, CMP is performed with respect to the insulating film which has been buried in the isolation trench provided in the semiconductor substrate according to the present invention. At this time, variations in the final thickness of the end-point detection film formed under the insulating film can be suppressed sufficiently so that the production of a step on the surface of the substrate after CMP is suppressed. Specifically, the height of a step produced on the surface of the wafer after STI-CMP, i.e., variations in planarization process can be adjusted to 30 nm or less at the portion of the semiconductor wafer serving as the semiconductor substrate other than the peripheral edge portion thereof extending radially about 2 mm from the edge surface thereof. This prevents a situation in which the step produced on the surface of the substrate causes a problem in the process step subsequent to CMP and thereby improves the reliability of the semiconductor device. This also enlarges the effective region of the semiconductor wafer, which is a determinant of the number of chips obtainable from the wafer. Since the number of chips obtainable from the semiconductor wafer can be increased, fabrication cost for the semiconductor device can be reduced.

In the second method for fabricating a semiconductor device, a polishing speed for the insulating film is preferably double or more a polishing speed for the end-point detection film in the step of planarizing the insulating film.

This enables reliable notification of whether or not planarization of the entire semiconductor wafer or in terms of semiconductor devices (chips) has been accomplished. This also prevents a situation in which the final thickness of the end-point detection film after CMP varies depending on the density of the isolation trenches in the single chip or the final thickness of the end-point detection film after CMP varies over the surface of the wafer depending on the density of the isolation trenches in the single chip.

Preferably, the second method for fabricating a semiconductor device further comprises, after the step of planarizing the insulating film, the step of: polishing the end-point detection film by chemical mechanical polishing.

The arrangement allows a gate electrode pattern or the like to be formed by, e.g., lithography with no size variation after the end-point detection film is removed by polishing.

A method for fabricating a semiconductor substrate is a method for fabricating a semiconductor substrate having a notch in an edge portion thereof, the method comprising the step of a processing step of mirror-polishing the edge portion, the processing step including the step of shaping each of two shoulder portions of the notch into an arc and adjusting a difference in curvature between the two shoulder portions to a value not less than 0 mm and not more than 0.1 mm.

Since the method for fabricating a semiconductor substrate performs processing such that the two shoulder portions of the notch have equal curvatures, the roughening of the specific portion of the polishing pad by the notch can be prevented when CMP is performed with respect to the semiconductor substrate. This achieves a uniform polishing speed over the entire surface of the polishing pad so that the uniformity of an amount of grinding of the polished film at the substrate surface is improved and variations in the final thickness of the polished film after CMP are suppressed sufficiently. This suppresses the production of a step on the surface of the substrate after CMP, prevents a situation in which a problem such as size variations or an inter-electrode short circuit during the formation of a gate electrode occurs, and thereby improves the reliability of the semiconductor device.

In the method for fabricating a semiconductor substrate according to the present invention, the processing step preferably includes the step of adjusting the curvature of each of the two shoulder portions to 0.3 mm or more.

The arrangement more reliably prevents the roughening of the surface of the polishing pad by the notch.

In the method for fabricating a semiconductor substrate according to the present invention, the processing step preferably includes the step of shaping a bottom portion of the notch into an arc and adjusting a curvature of the bottom portion to 1 mm or more. In this case, the processing step more preferably includes the step of mirror-finishing two wall surfaces of the notch to form an angle not less than 89° and not more than 95° therebetween.

The arrangement more reliably prevents the roughening of the surface of the polishing pad by the notch.

Thus, the present invention pertains to a semiconductor substrate, a method for fabricating the same, and a method for fabricating a semiconductor device and is particularly useful when it is applied to a semiconductor substrate to which CMP is performed.

DETAILED DESCRIPTION OF THE INVENTION

Figure 1:
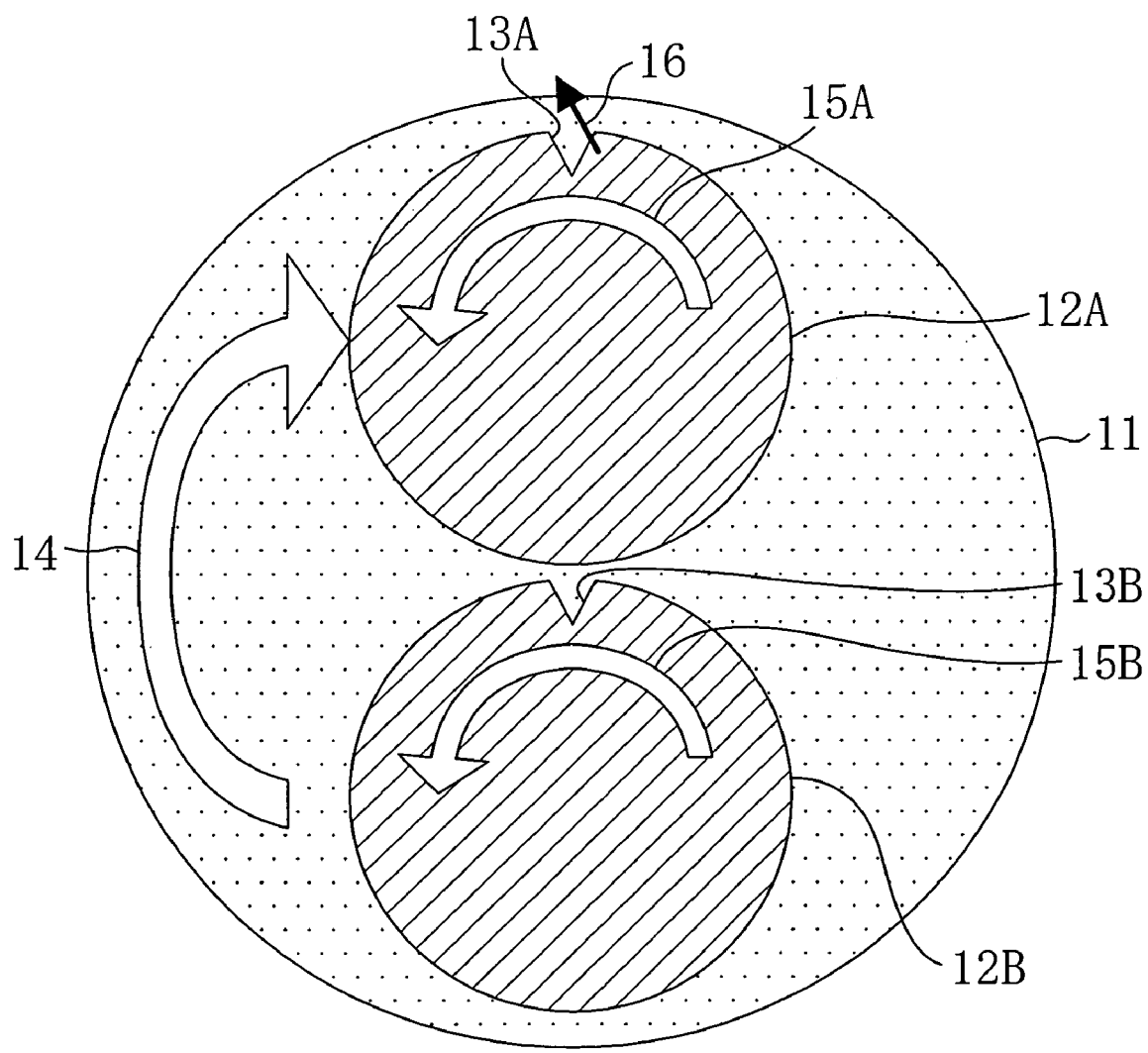
FIG. 1 is a schematic diagram of a polishing apparatus (CMP apparatus) used for the evaluation of the final thickness of a polished film, STI formation, or the like in each of the embodiments of the present invention.

FIG. 1 is a schematic diagram of a polishing apparatus (CMP apparatus) used for the evaluation of the final thickness of a polished film, STI formation, or the like in each of the embodiments of the present invention which will be described later. More specifically, FIG. 1 shows a CMP process performed while rotating each of a platen having a polishing pad affixed thereto and a semiconductor substrate (semiconductor wafer).

In the apparatus shown in FIG. 1, polishing is performed by disposing a pair of semiconductor substrates 12A and 12B in respective regions equally dividing a polishing pad 11 such that the two semiconductor substrates are polished simultaneously on the single platen. The semiconductor substrates 12A and 12B are provided with respective notches 13A and 13B. As shown in FIG. 1, CMP polishing is performed by pressing each of the semiconductor substrates 12A and 12B against the polishing pad 11, while rotating each of the polishing pad 11 and the semiconductor substrates 12A and 12B. During the CMP polishing, each of the semiconductor substrates 12A and 12B is pressed against the polishing pad 11 under a load of about 1 N/cm$^2$ or more so that pores in urethane foam composing the polishing pad 11 are crushed. As a result, an abrasive is not supplied evenly to the entire surface of each of the substrates and the polishing speed is thereby reduced. To prevent this, measures have been taken which uniformly move a dresser (not shown) having diamond mounted in fixed relation thereon over the polishing pad 11 to roughen the surface of the polishing pad 11 and thereby stabilize the polishing speed.

The direction 14 of rotation of the polishing pad 11, i.e., the platen is typically clockwise (CW). If the respective directions 15A and 15B of rotation of the semiconductor substrates 12A and 12B are counterclockwise (CCW), polishing uniformity at each of the substrates is improved. In this case, if attention is focused on, e.g., the rotation of the notch 13A in the semiconductor substrate 12A, the direction 16 in which each of the shoulder portions of the notch 13A plunges into the polishing pad 11 during polishing is at about 90 degrees relative to the surface of the polishing pad 11, so that the grinding of the surface of the polishing pad 11 by the notch 13A is expected.

Thus, each of the shoulder portions of the notch has the effect of roughening the surface of the polishing pad 11, not the effect of crushing the polishing pad 11, since it functions as a singularity point which perpendicularly hits on the polishing pad 11 during polishing. As a result, the surface portions of the polishing pad 11 corresponding to the loci followed by the notches 13A and 13B during, e.g., STI-CMP are roughened, which causes the possibility that the polishing speed of each of the loci portions of the polishing pad 11 is increased unintentionally. To prevent this, it is possible to set, e.g., the speed of rotation of each of the substrates 12A and 12B or the polishing pad 11 such that an arbitrary point on the semiconductor substrate 12A or 12B follows a random locus on the polishing pad 11 during polishing. However, since each of the substrates is not fixed completely to the head (not shown) of the CMP apparatus, it is difficult to render the locus on the polishing pad 11 followed by an arbitrary point on each of the substrates exactly as random as calculated so that the same locus occurs at each constant speed of rotation.

Each of the embodiments of the present invention, which will be described later, is capable of suppressing the production of steps on the wafer surface after CMP in a situation as described above.

Embodiment 1

A semiconductor substrate and a fabrication method therefor according to the first embodiment of the present invention will be described herein below with reference to the drawings.

The semiconductor substrate according to the first embodiment is characterized in that each of the two shoulder portions of a notch formed in an edge portion thereof has an arcuate configuration and the difference in curvature between the two shoulder portions is not less than 0 mm and not more than 0.1 mm. In other words, the two shoulder portions of the notch in the semiconductor substrate (semiconductor wafer) according to the first embodiment have equal configurations. This prevents the production of steps on the surface of the semiconductor wafer after, e.g., STI-CMP, specifically a reduction in the final thickness of a polished film at the peripheral edge portion of the wafer after STI-CMP.

Figure 2:
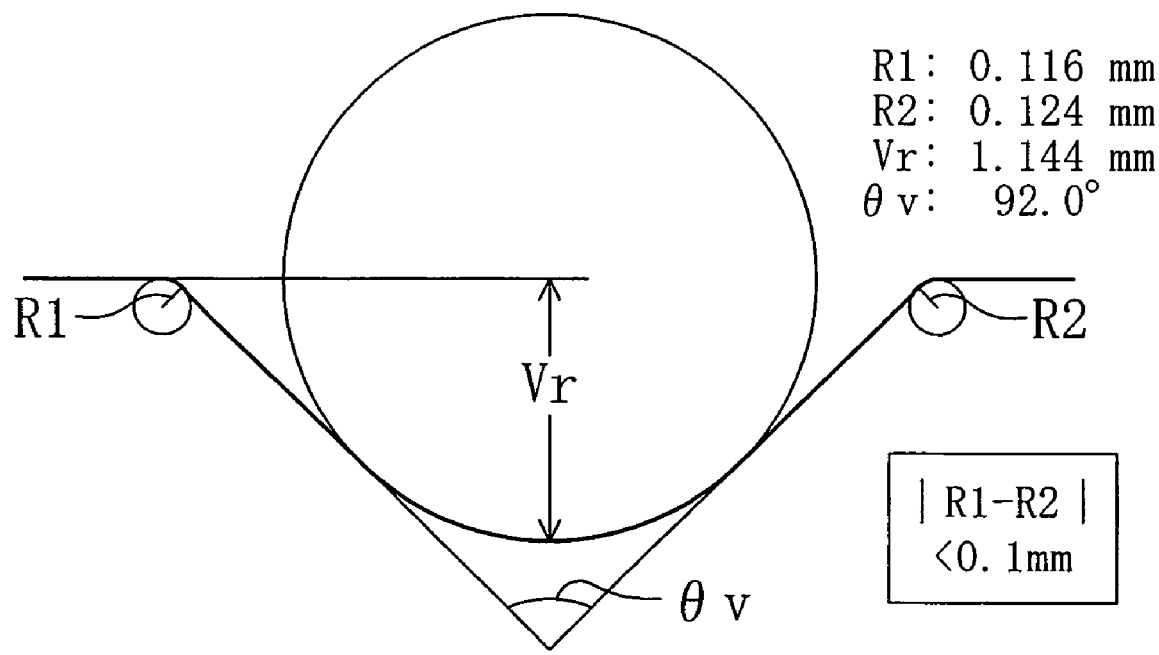
FIG. 2 shows an exemplary configuration of a notch in a semiconductor substrate according to the first embodiment of the present invention.

FIG. 2 shows an exemplary configuration of the notch in the semiconductor substrate according to the first embodiment. As a result of 3D measurement, it was found that the respective curvatures of the arcuate shoulder portions of the notch shown in FIG. 2 were as small as R1=0.116 mm and R2=0.124 mm. Here, |R1−R2|<0.1 mm is satisfied so that the difference in curvature between the two shoulder portions of the notch is small. In FIG. 2, Vr represents the depth of the notch and θv represents an angle formed between the two wall surfaces of the notch (except for the bottom portion of the notch).

Figure 3:
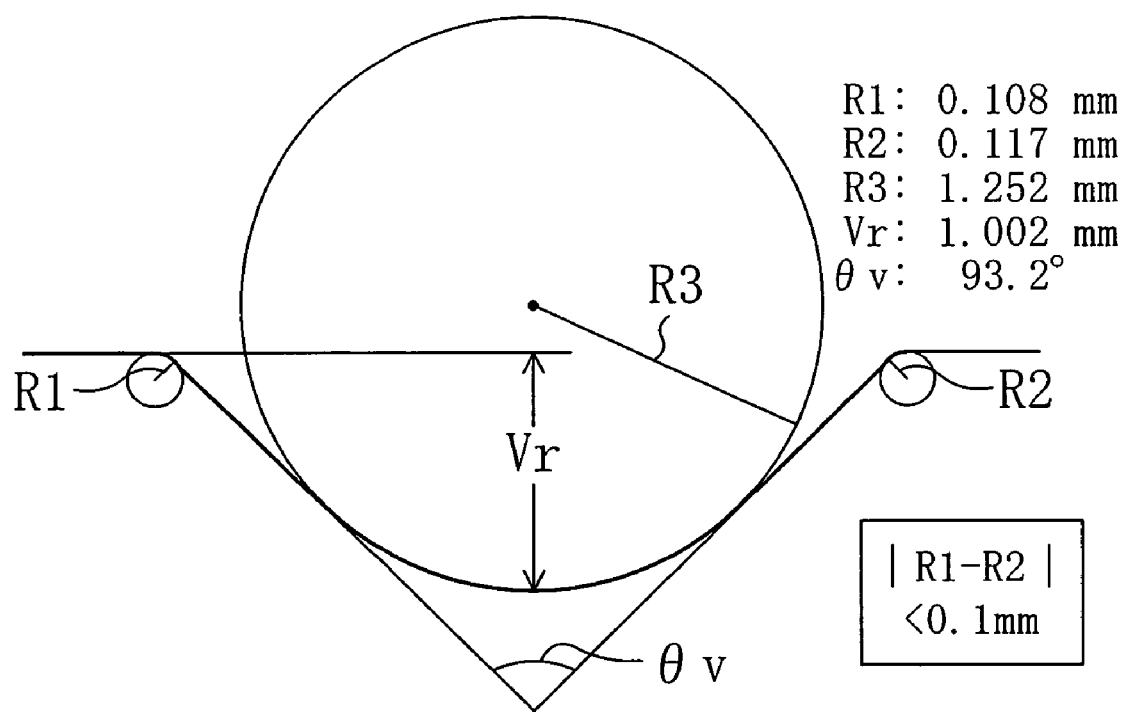
FIG. 3 shows another exemplary configuration of the notch in the semiconductor substrate according to the first embodiment.

FIG. 3 shows another exemplary configuration of the notch in the semiconductor substrate according to the first embodiment. As a result of 3D measurement, it was found that the respective curvatures of the arcuate shoulder portions of the notch shown in FIG. 3 were as small as R1=0.108 m and R2=0.117 mm. Here, |R1−R2|<0.1 mm is satisfied so that the difference in curvature between the two shoulder portions of the notch is small. The curvature R3 of the arcuate bottom portion of the notch shown in FIG. 3 has a value not less than 1.0 mm (which is specifically 1.252 mm). In FIG. 3 also, Vr represents the depth of the notch and θv represents an angle formed between the two wall surfaces of the notch (except for the bottom portion of the notch).

Figure 4:
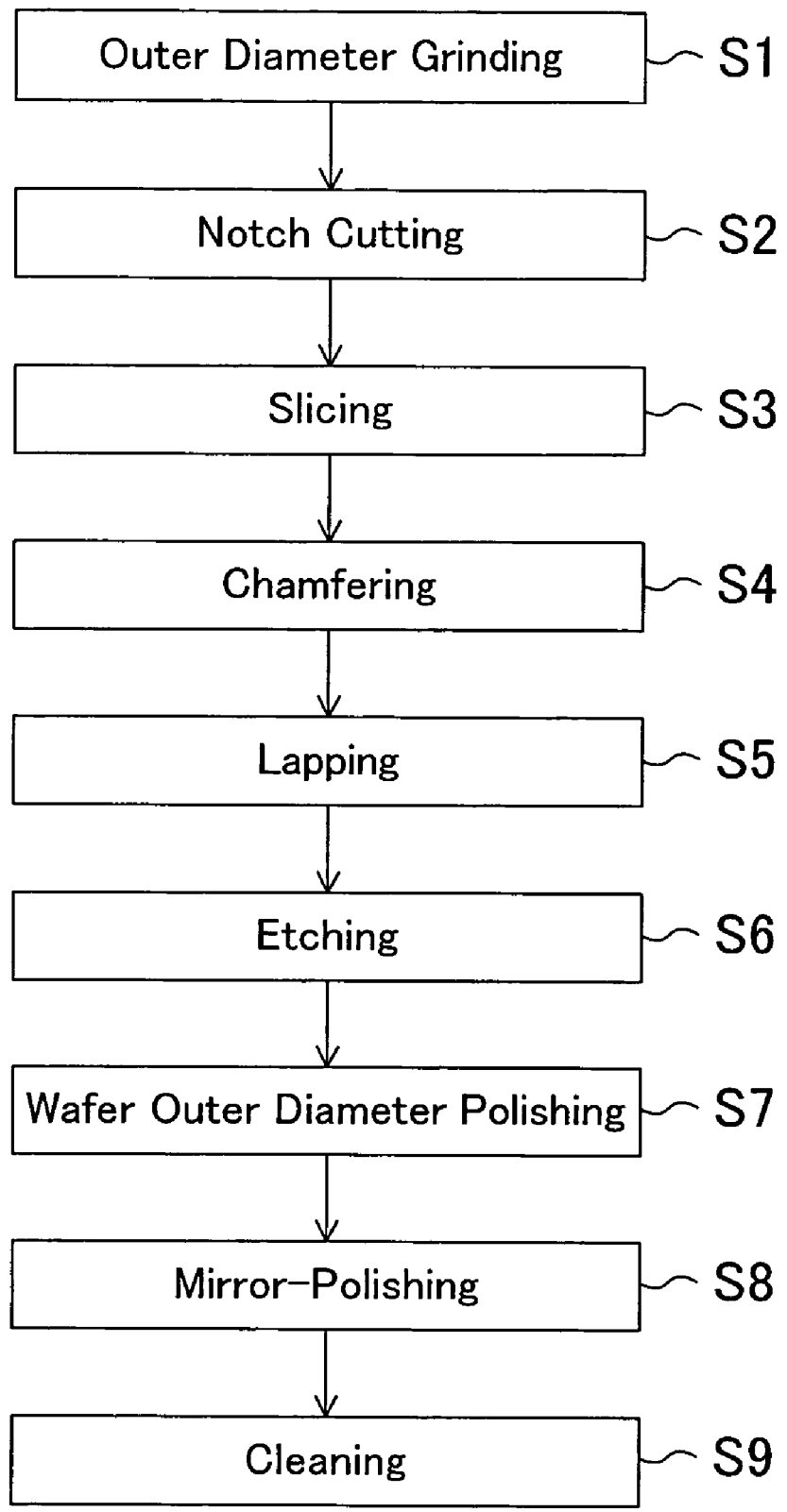
FIG. 4 is a flow chart illustrating a method for fabricating the semiconductor substrate according to the first embodiment.

FIG. 4 is a flow chart illustrating a method for fabricating the semiconductor substrate according to the first embodiment, i.e., a method for fabricating a semiconductor substrate as shown in FIG. 2 or 3 (wafer processing method).

First, in a first step S1, an ingot of, e.g., single-crystal silicon is subjected to outer diameter grinding using, e.g., a 3D grinding machine to be processed into a cylindrical configuration. Then, in a second step S2, a notch having a specified configuration is formed in the single-crystal silicon processed into the cylindrical configuration by using, e.g., a high-precision 3D cylindrical grinding machine. The formed notch serves as an alignment mark showing the crystal orientation of the single-crystal silicon.

Next, in a third step S3, the cylindrical single-crystal silicon is sliced by using, e.g., a slicing machine to be processed into disk-shaped wafers. Then, in a fourth step S4, chamfering (beveling) is performed with respect to the edge portion of each of the wafers by using, e.g., a cutting machine, thereby preventing the chipping of the outer circumferential portion of the wafer obtained by slicing. Then, in a fifth step S5, a wafer is lapped by using, e.g., a lapping apparatus for the removal of a crushed layer induced in the wafer surface by slicing. Then, in a sixth step S6, etching is performed with respect to a wafer by using a chemical solution for, e.g., chemical etching (wet etching) to remove a processing-induced deteriorated layer (layer deteriorated as a result of processing) remaining even after lapping.

Next, in a seventh step S7, the chamfered portion (edge surface and beveled surface) of the edge portion of the wafer is mirror-polished by using, e.g., an edge polishing apparatus for the planarization and flattening of the outer circumferential portion of the wafer, while the notched portion in the edge portion of the wafer is also mirror-polished by using, e.g., a notch polishing apparatus. In this step, the present embodiment shapes each of the two shoulder portions of the notch into an arc and adjusts the difference in curvature between the two shoulder portions of the notch to a value not less than 0 mm and not more than 0.1 mm. Preferably, the curvature of each of the two shoulder portions of the notch is adjusted to 0.3 mm or more. It is also preferable to shape the bottom portion of the notch into an arc and adjust the curvature of the bottom portion to 1 mm or more. In that case, it is more preferable to mirror-finish the two wall surfaces of the notch such that an angle not less than 89° and not more than 95° is formed therebetween. The arrangement reliably prevents the roughening of the polishing pad by the notch when CMP is performed with respect to the wafer according to the present embodiment. The mirror-polishing of the chamfered portion of the edge portion of the wafer and the mirror-polishing of the notched portion in the edge portion of the wafer may be performed either individually or simultaneously.

Next, in an eight step S8, single-side or double-side mirror-polishing is performed with respect to the wafer by using a polishing apparatus (CMP apparatus) to planarize and flatten the surface of the wafer. Then, in a ninth step S9, contamination such as fine particles, an organic material, or a heavy metal adhered to the surface of the wafer is removed and the wafer is washed by using a wet cleaning solution for the cleaning of the wafer. By the foregoing steps, the semiconductor substrate (wafer) according to the present embodiment shown in FIGS. 2, 3, or the like is obtainable.

Figure 5:
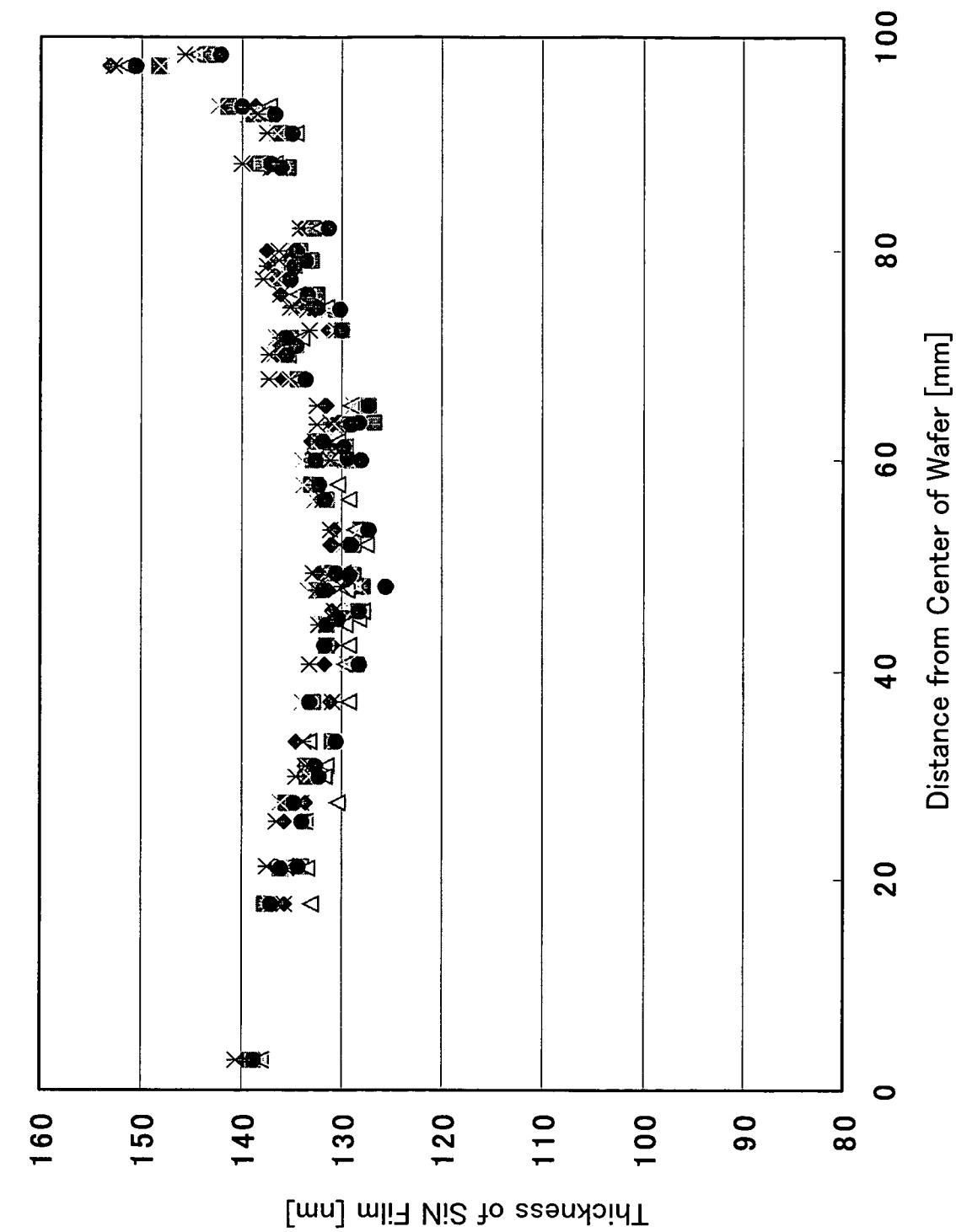
FIG. 5 shows the result of measuring the final thickness of an SiN film when STI-CMP is performed with respect to the semiconductor substrate according to the first embodiment.

FIG. 5 shows the result of measuring the final thickness of a polished film (SiN film) when STI-CMP involving three batch processes was performed with respect to semiconductor wafers (the total of six semiconductor wafers) each having the configuration of the notch shown in FIG. 2 by using the polishing apparatus shown in FIG. 1. In FIG. 5, the abscissa represents the distance from the center of the wafer (100 mm corresponds to the edge surface of the wafer) and the coordinate represents the thickness of the SiN film.

As shown in FIG. 5, the conventional problem of an abrupt reduction in the thickness of the SiN film at the peripheral edge portion of the wafer extending radially about 5 mm from the edge surface of the wafer (see a first or second comparative example which will be described later) is not observed. Conversely, the thickness of the SiN film is slightly larger at the peripheral edge portion of the wafer. The difference between the thickness of the SiN film at the peripheral edge portion of the wafer and the mean thickness of the SiN film at the portion of the wafer other than the peripheral edge portion thereof is about 10 nm. Variations in the thickness of the SiN film are also suppressed to about 20 nm or less, which is smaller than an objective value of 30 nm, in a range of the peripheral edge portion of the wafer extending radially about 2 to 3 mm from the edge surface of the wafer.

As stated previously, the result shown in FIG. 5 was obtained by using the polishing apparatus shown in FIG. 1, i.e., an apparatus capable of simultaneously polishing two semiconductor wafers on a single platen. The tendency of the variations in the thickness of the SiN film does not show a great difference even between semiconductor wafers in the individual batch processes (the timing of supplying a new slurry is different) and between the individual batch processes (the order in which the semiconductor wafers are processed is different). In either case, the variations were suppressed successfully to the objective value or less. This proves that the configuration of the notch in the semiconductor wafer has great influence on the variations in the thickness of the SiN film.

Thus, it will be understood from the first embodiment that the shaping of each of the two shoulder portions of the notch in the semiconductor wafer into an arc and the adjustment of the difference in curvature between the two shoulder portions to 0.1 mm or less is effective in controlling the final thickness of the SiN film after STI-CMP. Specifically, it is possible to prevent the specific portion of the polishing pad (which is the polishing pad 11 of FIG. 1 in the present embodiment) from being roughened by the notch when CMP is performed with respect to the wafer because the respective curvatures of the two shoulder portions of the notch in the semiconductor wafer are equal. As a result, the polishing speed becomes uniform over the entire surface of the polishing pad and the uniformity of an amount of grinding of the polished film on the wafer surface is thereby improved so that the variations in the final thickness of the polished film after CMP are suppressed sufficiently. This suppresses the production of steps on the surface of the wafer after CMP, prevents the occurrence of a problem such as size variations or an inter-electrode short circuit during the formation of a gate electrode, and thereby improves the reliability of the semiconductor device.

Since the first embodiment also allows the enlargement of the effective region of a semiconductor wafer, which is a determinant of the number of chips obtainable from the wafer, the number of the chips obtainable from the semiconductor wafer can be increased so that fabrication cost for the semiconductor device is reduced.

Although the first embodiment has been targeted at a semiconductor wafer with a diameter of 200 mm, it is not limited thereto. The same effects are achievable if the first embodiment is targeted at a semiconductor wafer of another size.

Although the first embodiment has assumed STI-CMP, it is not limited thereto.

The same effects are also achievable in a CMP process in which an interlayer film, a metal film, or the like is polished.

Although the first embodiment has used the polishing apparatus shown in FIG. 1, the same effects are also achievable if a polishing apparatus of another type, e.g., single wafer polishing apparatus, is used instead.

In the first embodiment, the configuration of the notch in the semiconductor wafer conforms to the SEMI standards except for the portion characterizing the present embodiment. Specifically, the depth of the notch is not less than 1.0 mm and not more than 1.25 mm and the angle of the notch (angle formed between the two wall surfaces of the notch) is not less than 89° and not more than 95°. If the bottom portion of the notch has an arcuate configuration with a given curvature or if the wall surfaces of the notch have been mirror-finished by a well-known method, the roughening of the polishing pad by the notch can be prevented more reliably. Specifically, the curvature of the bottom portion of the notch is preferably 1 mm or more. If consideration is given to the SEMI standards, the curvature of the bottom portion of the notch is about 1.5 mm at the maximum.

Embodiment 2

A semiconductor substrate and a fabrication method therefor according to the second embodiment of the present invention will be described with reference to the drawings.

A first feature of the semiconductor substrate according to the second embodiment is that each of the two shoulder portions of a notch formed in an edge portion thereof has an arcuate configuration and the difference in curvature between the two shoulder portions is not less than 0 mm and not more than 0.1 mm, in the same manner as in the first embodiment. A second feature of the semiconductor substrate according to the second embodiment is that the curvature of each of the shoulder portions of the notch is 0.3 mm or more. In other words, the two shoulder portions of the notch have equal configurations in the semiconductor substrate (semiconductor wafer) according to the second embodiment and, in addition, the curvature of each of the two shoulder portions of the notch is larger in the second embodiment than in the first embodiment. This reduces the pressure exerted on the polishing pad by the shoulder portions of the notch during polishing so that the production of steps on the surface of the semiconductor wafer after, e.g., STI-CMP, specifically a reduction in the final thickness of a polished film at the peripheral edge portion of the wafer after STI-CMP is prevented more reliably.

Figure 6:
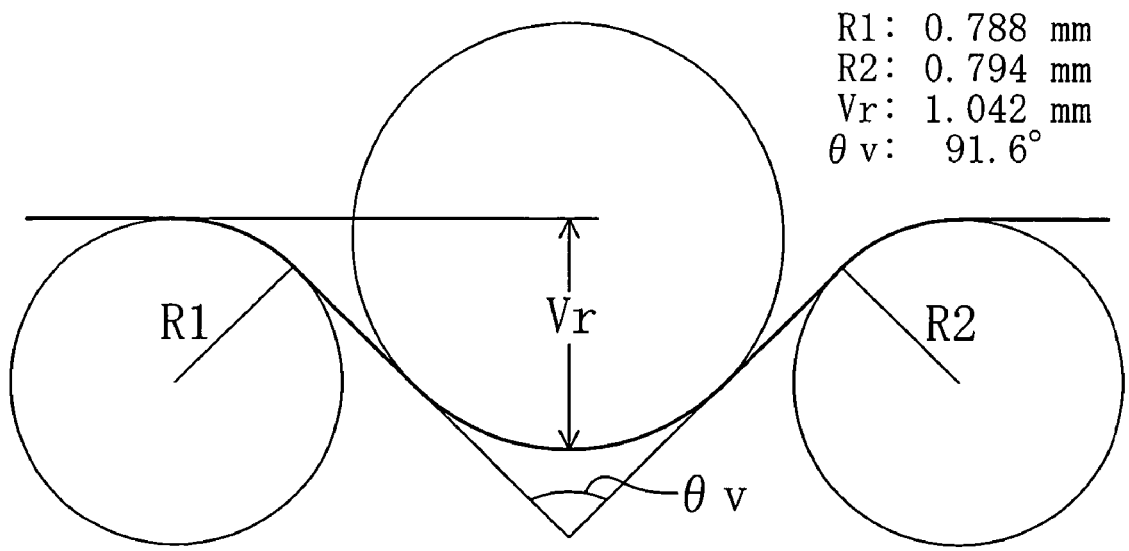
FIG. 6 shows an exemplary configuration of a notch in a semiconductor substrate according to the second embodiment of the present invention.

FIG. 6 shows an exemplary configuration of the notch in the semiconductor substrate according to the second embodiment. As a result of 3D measurement, it was found that the respective curvatures of the arcuate shoulder portions of the notch shown in FIG. 6 were as small as R1=0.788 mm and R2=0.794 mm. Here, |R1−R2|<0.1 mm, R1>0.3 mm, and R2>0.3 mm are satisfied. In FIG. 6, Vr represents the depth of the notch and θv represents an angle formed between the two wall surfaces of the notch (except for the bottom portion of the notch).

As for a method for fabricating the semiconductor substrate according to the second embodiment, i.e., a method for fabricating a semiconductor substrate as shown in FIG. 6 (wafer processing method), it is the same as shown in the flow chart of FIG. 4 according to the first embodiment.

Figure 7:
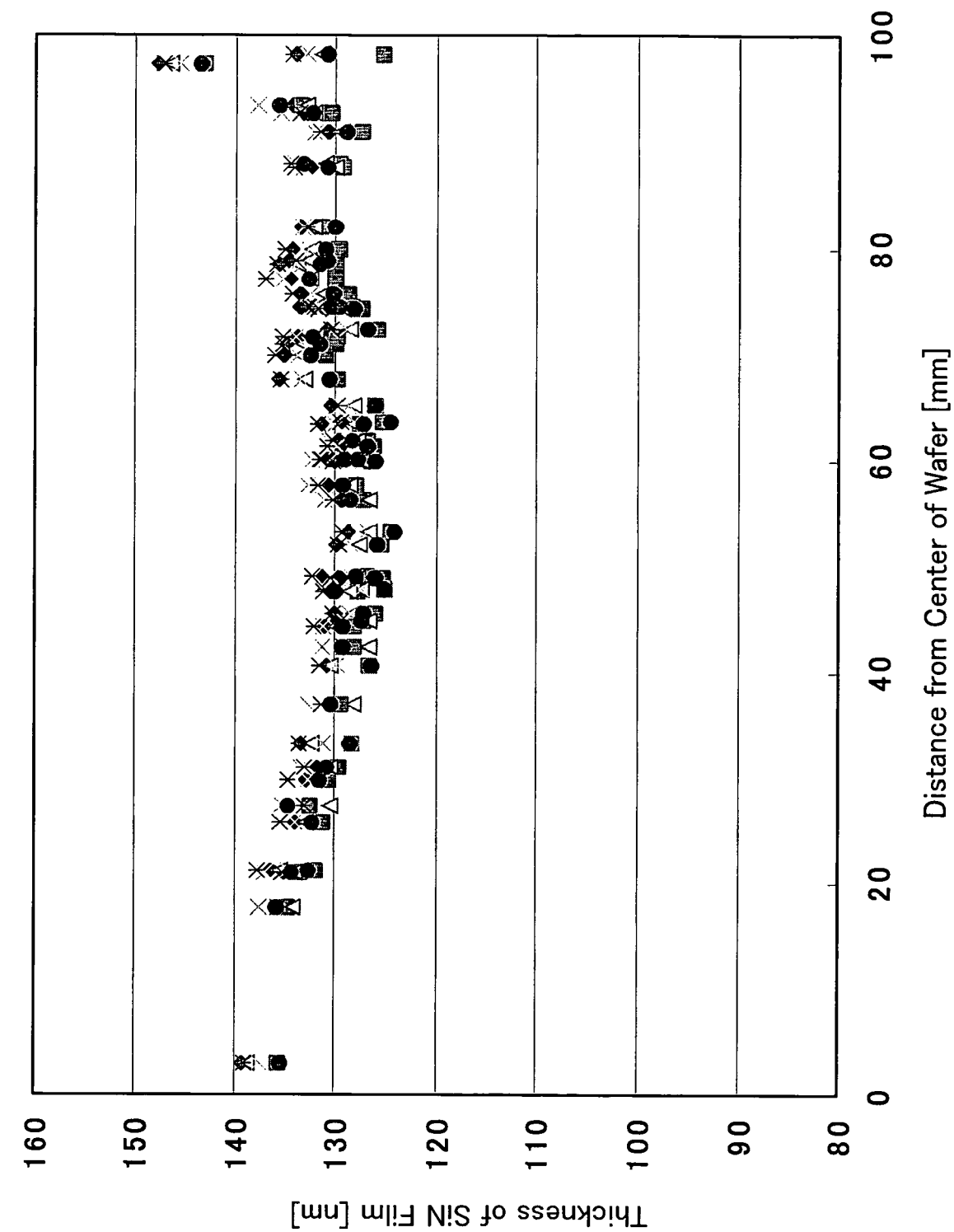
FIG. 7 shows the result of measuring the final thickness of an SiN film when STI-CMP is performed with respect to the semiconductor substrate according to the second embodiment.

FIG. 7 shows the result of measuring the final thickness of a polished film (SiN film) when STI-CMP involving three batch processes was performed with respect to semiconductor wafers (the total of six semiconductor wafers) each having the configuration of the notch shown in FIG. 6 by using the polishing apparatus shown in FIG. 1. In FIG. 7, the abscissa represents the distance from the center of the wafer (100 mm corresponds to the edge surface of the wafer) and the coordinate represents the thickness of the SiN film.

As shown in FIG. 7, the conventional problem of an abrupt reduction in the thickness of the SiN film at the peripheral edge portion of the wafer extending radially about 5 mm from the edge surface of the wafer (see the first or second comparative example which will be described later) is not observed. The thickness of the SiN film is substantially uniform over the entire surface of the wafer except that the SiN film is slightly thicker at a measurement point at a distance of about 3 mm from the edge surface of the wafer. The difference between the foregoing thickness of the SiN film at the peripheral edge portion of the wafer and the mean thickness of the SiN film at the portion of the wafer other than the peripheral edge portion thereof is 10 nm or less so that the difference has been reduced (improved) by about 2 to 3 nm compared with that obtained in the first embodiment. Variations in the thickness of the SiN film are also suppressed to about 15 nm or less, which is smaller than in the first embodiment, in a range of the peripheral edge portion of the wafer extending radially about 2 to 3 mm from the edge surface of the wafer.

As stated previously, the result shown in FIG. 7 was obtained by using the polishing apparatus shown in FIG. 1, i.e., an apparatus capable of simultaneously polishing two semiconductor wafers on a single platen. The tendency of the variations in the thickness of the SiN film does not show a great difference even between semiconductor wafers in the individual batch processes (the timing of supplying a new slurry is different) and between the individual batch processes (the order in which the semiconductor wafers are processed is different). In either case, the variations were suppressed successfully to the objective value (30 nm) or less. This proves that the configuration of the notch in the semiconductor wafer has great influence on the variations in the thickness of the SiN film.

Thus, it will be understood from the second embodiment that the adjustment of the difference in curvature between the two shoulder portions of the notch in the semiconductor wafer to 0.1 mm or less in the same manner as from the first embodiment and the adjustment of the curvature of each of the two shoulder portions to 0.3 mm or more is effective in controlling the final thickness of the SiN film after STI-CMP, particularly suppressing the variations in the final thickness of the SiN film at the peripheral edge portion of the wafer extending radially about 2 to 5 mm from the edge surface of the wafer to 30 nm or less. Specifically, it is possible to more reliably prevent the specific portion of the polishing pad (which is the polishing pad 11 of FIG. 1 in the present embodiment) from being roughened by the notch when CMP is performed with respect to the wafer because the respective curvatures of the two shoulder portions of the notch in the semiconductor wafer are equal and the curvature of each of the two shoulder portions is 0.3 mm or more. As a result, the polishing speed becomes uniform over the entire surface of the polishing pad and the uniformity of an amount of grinding of the polished film on the wafer surface is thereby improved so that the variations in the final thickness of the polished film after CMP are suppressed sufficiently. This suppresses the production of steps on the surface of the wafer after CMP, prevents the occurrence of a problem such as size variations or an inter-electrode short circuit during the formation of a gate electrode, and thereby improves the reliability of the semiconductor device.

Although the second embodiment has been targeted at a semiconductor wafer with a diameter of 200 mm, it is not limited thereto. The same effects are achievable if the second embodiment is targeted at a semiconductor wafer of another size.

Although the second embodiment has assumed STI-CMP, it is not limited thereto. The same effects are achievable in a CMP process in which an interlayer film, a metal film, or the like is polished.

Although the second embodiment has used the polishing apparatus shown in FIG. 1, the same effects are achievable if a polishing apparatus of another type, e.g., single wafer polishing apparatus, is used instead.

In the second embodiment, the configuration of the notch in the semiconductor wafer conforms to the SEMI standards except for the portion characterizing the present embodiment. Specifically, the depth of the notch is not less than 1.0 mm and not more than 1.25 mm and the angle of the notch (angle formed between the two wall surfaces of the notch) is not less than 89° and not more than 95°. If the bottom portion of the notch has an arcuate configuration with a given curvature or if the wall surfaces of the notch have been mirror-finished by a well-known method, the roughening of the polishing pad by the notch can be prevented more reliably. Specifically, the curvature of the bottom portion of the notch is preferably 1 mm or more. If consideration is given to the SEMI standards, the curvature of each of the two shoulder portions of the notch in the semiconductor substrate is about 2.0 mm at the maximum and the curvature of the bottom portion of the notch is about 1.5 mm at the maximum.

COMPARATIVE EXAMPLE 1

Figure 8:
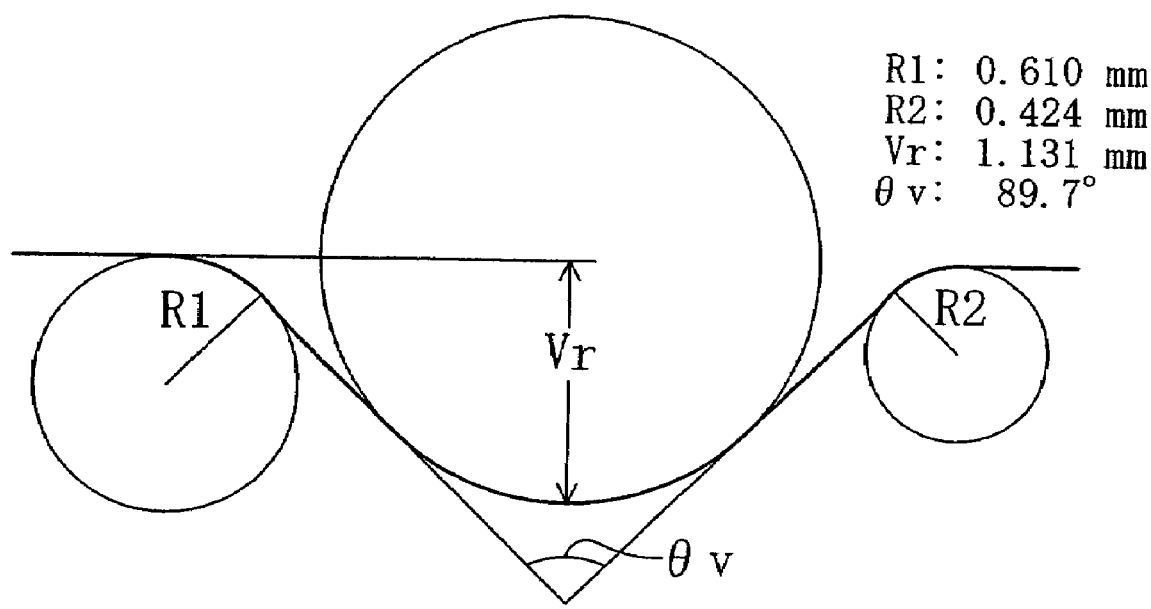
FIG. 8 is a view showing an exemplary configuration of a notch in a semiconductor substrate according to a first comparative example.

FIG. 8 shows an exemplary configuration of a notch in the semiconductor substrate according to a first comparative example. As a result of 3D measurement, it was found that the respective curvatures of the arcuate shoulder portions of the notch shown in FIG. 8 were R1=0.610 mm and R2=0.424 mm so that |R1−R2|>0.1 mm is satisfied. In FIG. 8, Vr represents the depth of the notch and θv represents an angle formed between the two wall surfaces of the notch (except for the bottom portion of the notch).

When the wall surfaces of the notch are, e.g., mirror-finished, the final angles of the two shoulder portions of the notch normally vary due to the deterioration of the polishing cloth of a polishing machine so that a difference exceeding 0.1 mm is produced disadvantageously between the respective curvatures of the two shoulder portions of the notch. In other words, the two shoulder portions of the notch have asymmetric arcuate configurations.

Figure 9:
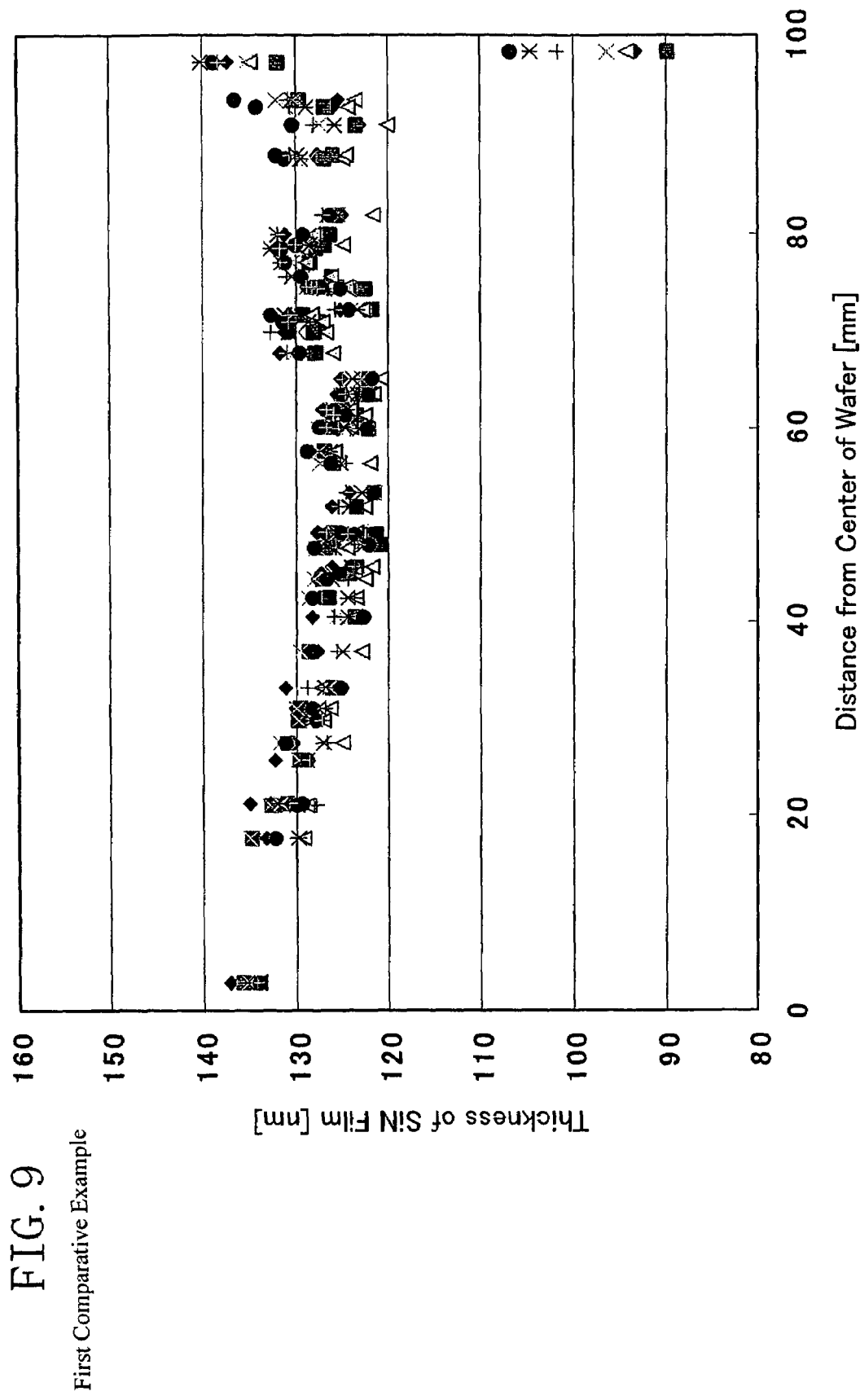
FIG. 9 shows the result of measuring the final thickness of an SiN film when STI-CMP is performed with respect to the semiconductor substrate according to the first comparative example.

FIG. 9 shows the result of measuring the final thickness of a polished film (SiN film) when STI-CMP involving three batch processes and one single-wafer process was performed with respect to semiconductor wafers (the total of seven semiconductor wafers) each having the configuration of the notch shown in FIG. 8 by using the polishing apparatus shown in FIG. 1. In FIG. 9, the abscissa represents the distance from the center of the wafer (100 mm corresponds to the edge surface of the wafer) and the coordinate represents the thickness of the SiN film.

As shown in FIG. 9, the problem of an abrupt reduction in the thickness of the SiN film at the peripheral edge portion of the wafer extending radially about 5 mm from the edge surface thereof is observed. Specifically, the thickness of the SiN film at the peripheral edge portion of the wafer is smaller by about 20 nm or more than the mean thickness of the SiN film at the portion of the wafer other than the peripheral edge portion thereof The variations in the thickness of the SiN film have reached about 45 nm in a range of the peripheral edge portion of the wafer extending radially about 2 to 3 mm from the edge surface thereof so that the objective value of 30 nm has not been achieved.

As stated previously, the result shown in FIG. 9 was obtained by using the polishing apparatus shown in FIG. 1, i.e., an apparatus capable of simultaneously polishing two semiconductor wafers on a single platen. The tendency of the variations in the thickness of the SiN film does not show a great difference even between semiconductor wafers in the individual batch processes (the timing of supplying a new slurry is different), between the individual batch processes (the order in which the semiconductor wafers are processed is different), or between the batch processes and the single-wafer process. In either case, the variations have not been suppressed to the objective value or less. This proves that the configuration of the notch in the semiconductor wafer has great influence on the variations in the thickness of the SiN film.

COMPARATIVE EXAMPLE 2

Figure 10:
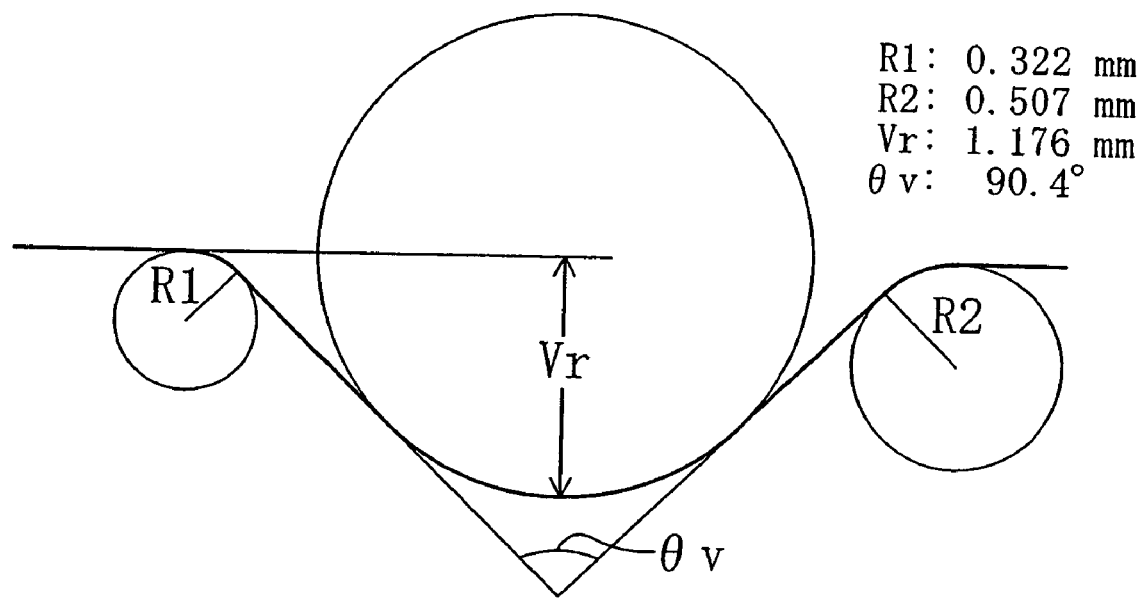
FIG. 10 is a view showing an exemplary configuration of a notch in a semiconductor substrate according to a second comparative example.

FIG. 10 shows an exemplary configuration of a notch in the semiconductor substrate according to a second comparative example. As a result of 3D measurement, it was found that the respective curvatures of the arcuate shoulder portions of the notch shown in FIG. 10 were R1=0.322 mm and R2=0.507 mm so that |R1−R2|>0.1 mm is satisfied. In FIG. 10, Vr represents the depth of the notch and θv represents an angle formed between the two wall surfaces of the notch (except for the bottom portion of the notch).

When the wall surfaces of the notch are, e.g., mirror-finished, the final angles of the two shoulder portions of the notch normally vary due to the deterioration of the polishing cloth of a polishing machine so that a difference exceeding 0.1 mm is produced disadvantageously between the respective curvatures of the two shoulder portions of the notch. In other words, the two shoulder portions of the notch have asymmetric arcuate configurations.

Figure 11:
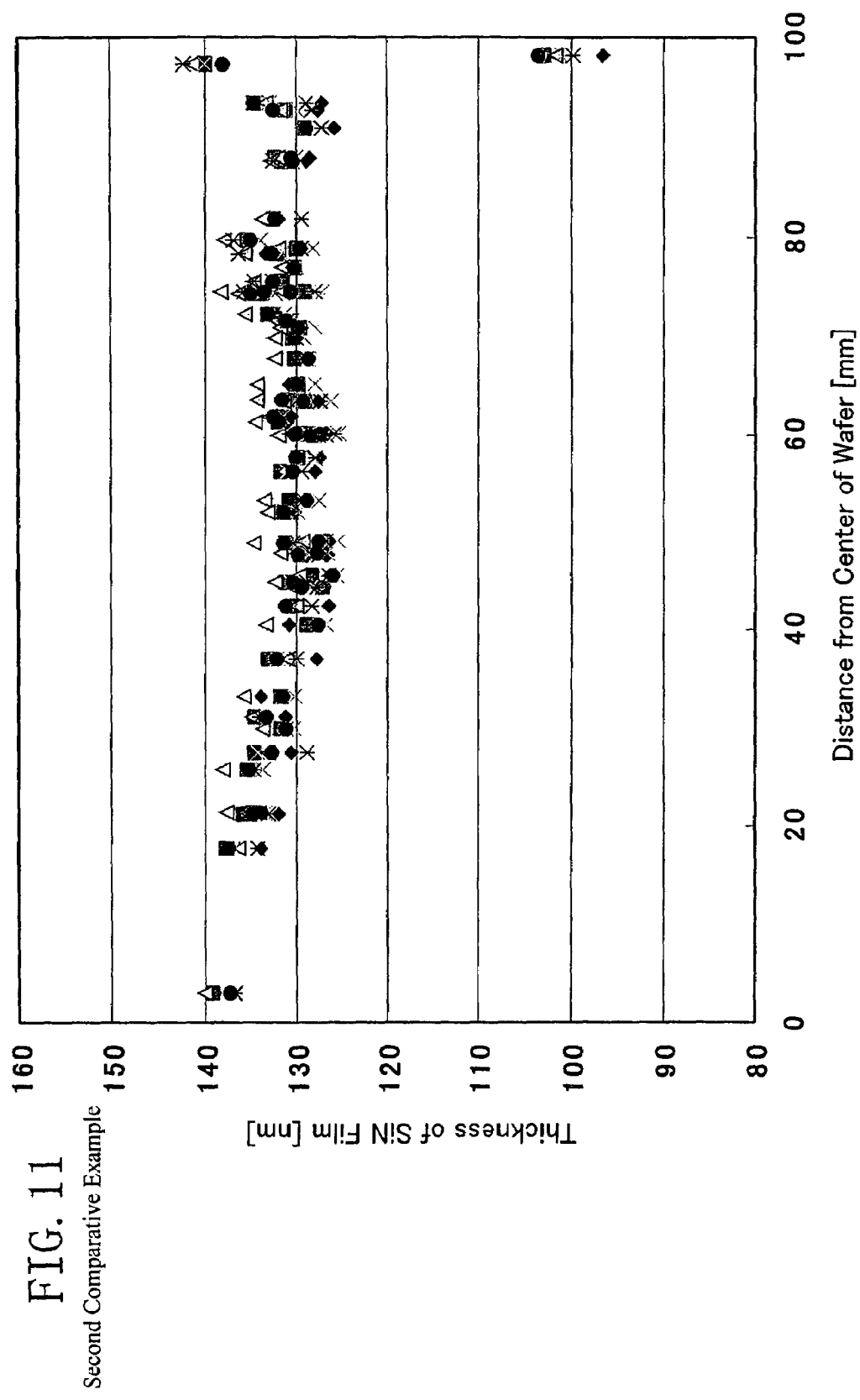
FIG. 11 shows the result of measuring the final thickness of an SiN film when STI-CMP is performed with respect to the semiconductor substrate according to the second comparative example.

FIG. 11 shows the result of measuring the final thickness of a polished film (SiN film) when STI-CMP involving three batch processes was performed with respect to semiconductor wafers (the total of six semiconductor wafers) each having the configuration of the notch shown in FIG. 10 by using the polishing apparatus shown in FIG. 1. In FIG. 11, the abscissa represents the distance from the center of the wafer (100 mm corresponds to the edge surface of the wafer) and the coordinate represents the thickness of the SiN film.

As shown in FIG. 11, the problem of an abrupt reduction in the thickness of the SiN film at the peripheral edge portion of the wafer extending radially about 5 mm from the edge surface thereof is observed. Specifically, the thickness of the SiN film at the peripheral edge portion of the wafer is smaller by about 20 nm or more than the mean thickness of the SiN film at the portion of the wafer other than the peripheral edge portion thereof The variations in the thickness of the SiN film have reached about 45 nm in a range of the peripheral edge portion of the wafer extending radially about 2 to 3 mm from the edge surface thereof so that the objective value of 30 nm has not been achieved.

As stated previously, the result shown in FIG. 11 was obtained by using the polishing apparatus shown in FIG. 1, i.e., an apparatus capable of simultaneously polishing two semiconductor wafers on a single platen. The tendency of the variations in the thickness of the SiN film does not show a great difference even between semiconductor wafers in the individual batch processes (the timing of supplying a new slurry is different) and between the individual batch processes (the order in which the semiconductor wafers are processed is different). In either case, the variations have not been suppressed to the objective value or less. This proves that the configuration of the notch in the semiconductor wafer has great influence on the variations in the thickness of the SiN film.

Embodiment 3

Referring to the drawings, a method for fabricating a semiconductor device according to a third embodiment of the present invention, specifically a method for fabricating a semiconductor device using the semiconductor substrate (semiconductor substrate characterized by the configurations of the shoulder portions of the notch) according to the first or second embodiment will be described herein below.

Figure 12A:
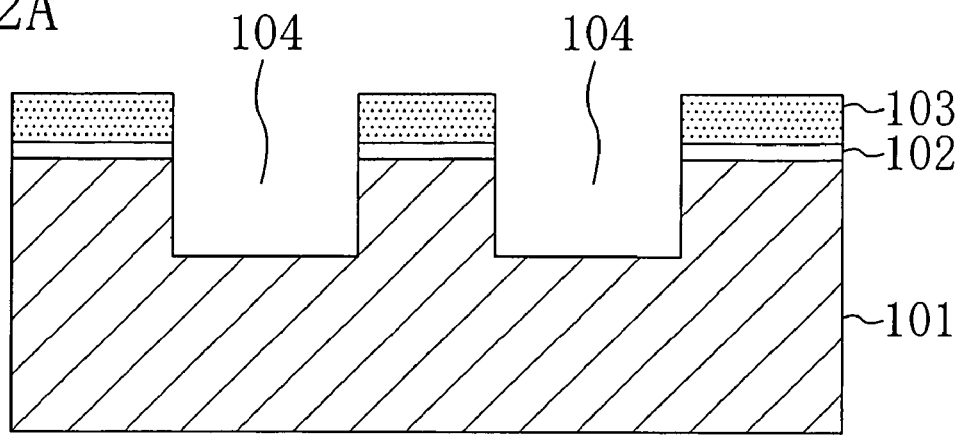
FIGS. 12A to 12C are cross-sectional views illustrating the individual process steps of a method for fabricating a semiconductor device according to the third embodiment of the present invention.
Figure 12B:
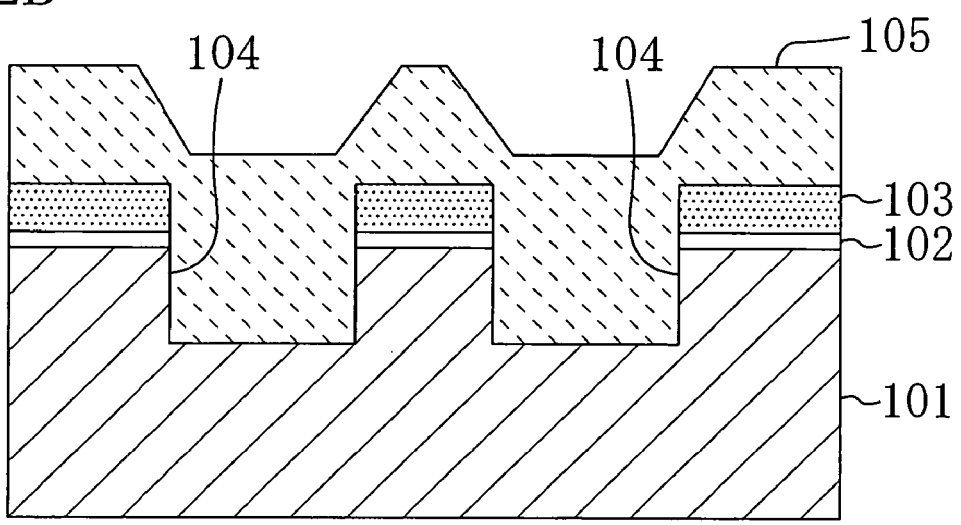
Figure 12C:
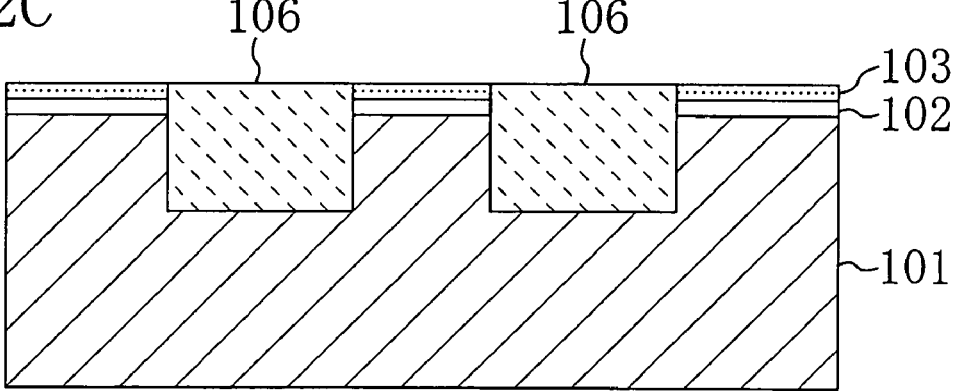

FIGS. 12A to 12C are cross-sectional views illustrating the individual process steps of the method for fabricating a semiconductor device according to the third embodiment.

First, as shown in FIG. 12A, a protective oxide film (SiO$_2$ film) 102 and a nitride film (SiN film) 103 serving as an end-point detection film for STI-CMP are formed successively on a semiconductor substrate 101. A notch with two shoulder portions having a curvature difference not less than 0 mm and not more than 0.1 mm therebetween is provided in the edge portion of the semiconductor substrate 101. Preferably, the curvature of each of the two shoulder portions of the notch is 0.3 mm or more. The protective oxide film 102 serves as a buffer film between the semiconductor substrate 101 and the nitride film 103.

Subsequently, a resist pattern (not shown) having an opening corresponding to an isolation region is formed by lithography. By using the resist pattern as a mask, dry etching is performed successively with respect to the nitride film 103, the protective oxide film 102, and the semiconductor substrate 101, thereby forming a trench 104 for isolation.

Next, as shown in FIG. 12B, a buried oxide film 105 is deposited by CVD over the entire surface of the semiconductor substrate 101, thereby filling the trench 104 such that no void is formed.

Next, as shown in FIG. 12C, the portion of the buried oxide film 105 deposited on the active region to be formed with a semiconductor element, i.e., the portion of the buried oxide film 105 located outside the trench 104 is removed by CMP, whereby an isolation (STI) 106 composed of the buried oxide film 105 is formed in the trench 104.

When the nitride film 103 is exposed, the reflectivity of light or the rotation torque of the platen of a polishing machine, which is detected by an end-point detector, changes so that the point of time at which the change occurred is detected as the end point of polishing performed with respect to the buried oxide film 105. The final adjustment of a height difference in the CMP step shown in FIG. 12C is performed by using polishing conditions under which a polishing speed for the buried oxide film 105 is double or more a polishing speed for the nitride film 103. The arrangement suppresses the occurrence of a height difference between the surface of the buried oxide film 105 composing the isolation 106 and the surface of the other portion of the substrate. The final adjustment of the height difference is performed by adjusting the rotational speed of the head (which is a portion for holding the substrates, while being rotated therewith) of a CMP apparatus, a loading condition therefor, the rotational speed of a platen having a polishing pad affixed thereto, the material of a slurry, or the like.

According to the third embodiment, the semiconductor substrate according to the first or second embodiment, i.e., the semiconductor substrate 101 in which the notch with the two shoulder portions having a curvature difference not less than 0 mm and not more than 0.1 mm therebetween has been provided is formed with the trench 104 and then the buried oxide film 105 is buried in the trench 104 and subjected to CMP. At this time, variations in the final thickness of the nitride film 103 (i.e., the end-point detection film) formed under the buried oxide film 105 can be suppressed sufficiently so that the production of a step on the surface of the substrate after CMP is suppressed. Specifically, the height of a step produced on the surface of the wafer after STI-CMP, i.e., variations in planarization process can be suppressed to 30 nm or less even in a range extending radially about 2 to 5 mm from the edge surface of the semiconductor wafer serving as the semiconductor substrate 101. This prevents a situation in which the step produced on the surface of the substrate causes a problem in the process step subsequent to CMP and thereby improves the reliability of the semiconductor device. In addition, the effective region of the wafer which is a determinant of the number of chips obtainable from the semiconductor wafer can be enlarged. Since the number of chips obtainable from the semiconductor wafer can be increased, fabrication cost for the semiconductor device can be reduced.

According to the third embodiment, the polishing conditions under which the polishing speed for the buried oxide film 105 is double or more the polishing speed for the nitride film (end-point detection film) 103 are used in the step of planarizing the buried oxide film 105. This enables reliable notification of whether or not planarization of the entire semiconductor wafer serving as the semiconductor substrate 101 or in terms of semiconductor devices (chips) has been accomplished. This also prevents a situation in which the final thickness of the nitride film 103 (end-point detection film) after CMP varies depending on the density of the trenches 104 in the single chip or the final thickness of the nitride film 103 after CMP varies over the surface of the wafer depending on the density of the trenches 104 in the single chip.

In the third embodiment the size of the semiconductor wafer serving as the semiconductor substrate 101 is not particularly limited.

Although the third embodiment has assumed STI-CMP, it is not limited thereto. The same effects are achievable in a CMP process in which an interlayer film, a metal film, or the like is polished.

In the third embodiment, the polishing apparatus used for STI-CMP is not particularly limited.

In the third embodiment, the configuration of the notch in the semiconductor wafer serving as the semiconductor substrate 101 conforms to the SEMI standards except for the portion characterizing the semiconductor substrate according to the first or second embodiment. Specifically, the depth of the notch is not less than 1.0 mm and not more than 1.25 mm and the angle of the notch (angle formed between the two wall surfaces of the notch) is not less than 89° and not more than 95°. If the bottom portion of the notch has an arcuate configuration with a given curvature or if the wall surfaces of the notch have been mirror-finished by a well-known method, the roughening of the polishing pad by the notch can be prevented more reliably. Specifically, the curvature of the bottom portion of the notch is preferably 1 mm or more. If consideration is given to the SEMI standards, the curvature of each of the two shoulder portions of the notch in the semiconductor substrate is about 2.0 mm at the maximum and the curvature of the bottom portion of the notch is about 1.5 mm at the maximum.

Preferably, the third embodiment comprises the step of polishing the nitride film 103, i.e., the end-point detection film by chemical mechanical polishing after the step of planarizing the buried oxide film 105. The arrangement allows a gate electrode pattern or the like to be formed with no size variation by, e.g., lithography after the removal of the nitride film 103 by polishing.

What is claimed is:
1. A semiconductor substrate having a notch in an edge portion thereof,
the notch having two shoulder portions each configured as an arc and a difference in curvature between the two shoulder portions being not less than 0 mm and not more than 0.1 mm, wherein each of the two shoulder portions has a curvature not less than 0.3 mm and not more than 2.0 mm.

2. The semiconductor substrate of claim 1, wherein the notch has a bottom portion configured as an arc and the bottom portion has a curvature not less than 1 mm and not more than 1.5 mm.

3. The semiconductor substrate of claim 1, wherein the notch has two wall surfaces each mirror-finished and forming an angle not less than 89° and not more than 95° therebetween.

4. A method for fabricating a semiconductor substrate having a notch in an edge portion thereof, the method comprising the step of:

a processing step of mirror-polishing the edge portion, the processing step including the step of shaping each of two shoulder portions of the notch into an arc and adjusting a difference in curvature between the two shoulder portions to a value not less than 0 mm and not more than 0.1 mm, wherein the processing step includes the step of adjusting the curvature of each of the two shoulder portions to 0.3 mm or more and 2.0 mm or less.

5. The method of claim 4, wherein the processing step includes the step of shaping a bottom portion of the notch into an arc and adjusting a curvature of the bottom portion to 1 mm or more and 1.5 mm or less.

6. The method of claim 4, wherein the processing step includes the step of mirror-finishing two wall surfaces of the notch to form an angle not less than 89° and not more than 95° therebetween.

* * * * *